United States Patent [19]

Hua et al.

[11] Patent Number: 4,978,639
[45] Date of Patent: Dec. 18, 1990

[54] METHOD FOR THE SIMULTANEOUS FORMATION OF VIA-HOLES AND WRAPAROUND PLATING ON SEMICONDUCTOR CHIPS

[75] Inventors: Chang-Hwang Hua, Palo Alto; Simon S. Chan, Belmont; Ding-Yuan S. Day, Sunnyvale; Adrian C. Lee, Fremont, all of Calif.

[73] Assignee: Avantek, Inc., Milpitas, Calif.

[21] Appl. No.: 295,300

[22] Filed: Jan. 10, 1989

[51] Int. Cl.$^5$ .............................................. H01L 21/02
[52] U.S. Cl. ...................... 437/230; 437/226; 437/245; 437/974; 148/DIG. 28; 148/DIG. 135; 156/643; 156/656
[58] Field of Search .............. 437/226, 227, 230, 245, 437/974; 148/DIG. 28, DIG. 135; 156/643, 656

[56] References Cited

U.S. PATENT DOCUMENTS

| | | | |
|---|---|---|---|
| 3,323,198 | 6/1967 | Shortes | 29/155.5 |
| 3,484,341 | 12/1969 | Devitt | 204/15 |
| 3,562,009 | 2/1971 | Cranston et al. | 117/227 |
| 4,089,992 | 5/1978 | Doo et al. | 427/94 |
| 4,153,988 | 5/1979 | Doo | 29/626 |
| 4,211,603 | 7/1980 | Reed | 156/659.1 |
| 4,348,253 | 9/1982 | Subbarao et al. | 156/643 |
| 4,403,241 | 9/1983 | Butherus et al. | 357/55 |
| 4,426,767 | 1/1984 | Swanson et al. | 29/571 |
| 4,467,521 | 8/1984 | Spooner et al. | 29/576 E |
| 4,512,829 | 4/1985 | Ohta et al. | 156/659.1 |

FOREIGN PATENT DOCUMENTS 0004341 3/1987 Japan.

OTHER PUBLICATIONS

Tenedorio, Jaime G., "The Materials Properties and Microwave Performance of the Gallium Arsenide Power MESFET", May 1982, Ch. 6.

*Primary Examiner*—Brian E. Hearn
*Assistant Examiner*—Tuan Nguyen
*Attorney, Agent, or Firm*—Limbach, Limbach & Sutton

[57] ABSTRACT

Metallized via-holes and a wraparound metal plating are simultaneously formed on semiconductor chips by patterning a photoresist mask on the front surface of the wafer to open windows over metal pads as well as the grid areas where wraparound plating is desired; etching off the exposed metal if necessary and forming via-holes and grooves in the wafer by reactive ion etching to a depth which is less than the total thickness of the wafer; depositing a thin conductive film along the walls of the grooves and via-holes by electroless methods; plating the walls of the grooves and the via-holes with conductive metal by electrolytic methods; removing the back surface of the wafer ("backlapping") along with the floors of both the grooves and the via-holes, to expose the metal on the wall of the via-holes and separate the individual chips; and, depositing conductive metal on the back surface of the individual chips to complete the grounding path.

8 Claims, 2 Drawing Sheets

METHOD FOR THE SIMULTANEOUS FORMATION OF VIA-HOLES AND WRAPAROUND PLATING ON SEMICONDUCTOR CHIPS

FIELD OF THE INVENTION

This invention relates to the field of semiconductor processing. More particularly, this invention discloses a simple method of forming metallized via-holes and wraparound plating.

BACKGROUND OF THE INVENTION

Semiconductor chips are usually produced from large wafers of semiconductor material such as, for example, silicon or gallium arsenide, from which a plurality of chips can be produced The dimensions of the individual chips are delineated by scoring or grooving the wafer in checkerboard fashion. Each chip is provided with a circuit pattern by metallizing and etching through masks using standard photoresist methods. The final step of the process involves separating the individual chips from the wafer. If this is done by breaking or cutting along the grooves which delineate the boundaries of the individual chips, defects may result from cracked or chipped edges which are cosmetically unsightly and which may effect the performance of the chip.

Semiconductor chips can be produced having circuit patterns on both sides of the chip, or can be designed to connect to or interact with other electronic components or other semiconductor chips. Conductive via-holes are commonly used for connecting the circuit pattern for a chip on one side of the wafer to a corresponding circuit pattern on the other side of the chip, or for connecting the circuit on one side of the chip to a ground, to another electronic component, or to the circuit pattern on another chip.

Various techniques are known for providing conductive via-holes. In one such technique, metal pads are formed on the front side of the wafer, and holes are etched through the semiconductor chip from the back side of the wafer to abut the metal pads. This is followed by coating the inside of the hole and the back side of the wafer with a conductive metal layer using ordinary semiconductor processing techniques, such as sputtering or electroless plating. Finally, the structure is then electroplated using the metal pads and the conductive metal layer as a cathode to fill up the remainder of the via-hole.

Unfortunately, this method often leaves voids in the via-hole. During the electroplating, the higher electric field at the corners where the vertical walls of the holes intersect the horizontal surface of the wafer result in higher current densities and therefore higher plating rates. This causes the electroplated metal to be deposited more rapidly in the regions of higher electric field. As a result, the top of the hole adjacent to the back side of the wafer fills in more rapidly than the bottom of the hole abutting the metal pad. Eventually the top of the hole will close before the hole is completely filled, creating an unmetallized cavity inside the via hole. Further, undesirable surface irregularities, such as bumps, are formed on the back side of the wafer surrounding the holes due also to the higher electric field in these regions. These surface irregularities make it more difficult to form a secure structural bond to hold the chip in place. Finally, because the hole is created from the back of the wafer, time and effort and the use of infrared equipment is required to align the hole with the devices on the front side of the wafer.

In another technique proposed in U.S. Pat. No. 4,348,253 to Subbarao et. al., the holes used as vias are not terminated by metal pads. Circuit patterns are formed on the front side of the semiconductor wafer, holes are drilled through the wafer from the front side to the back using a precision laser, the wafer is metallized on the back side. The backside is then mounted on an electroplating block using an insulating adhesive layer, and the via is electroplated using the back side metallization as a cathode.

This approach is flawed in several ways. Because each hole in the wafer must be individually drilled using a precision laser, significant processing time is required. Further, local heating from the laser may cause surface and structural damage within the semiconductor material. Finally, this process may also produce voids in the via-hole adjacent to the adhesive layers.

Examples of other techniques of forming plated or metallized vias include the methods disclosed in U.S. Pat. No. 3,562,009 and U.S. Pat. No. 3,323,198 in which a laser beam and a high energy electron beam, respectively, are used to drill a hole through a wafer and a metal structure on the surface of the wafer, vaporizing the metal and depositing it on the inner surfaces of the hole. Once again, this involves significant processing time and may cause surface and structural damage within the semiconductor material.

Two improved methods for providing metallized vias are disclosed in our pending applications, Ser. No. 192,199 filed May 10, 1988 for a Method of Selective Via-Hole and Heat Sink Plating Using a Metal Mask filed May 10, 1988 and Ser. No. 192,343 filed May 10, 1988 for A Method of Forming Completely Metallized Via Holes in Semiconductors.

Plating on the edges of the chip would provide additional grounding and edge protection. None of the methods discussed above disclose a method for simultaneously forming plating on the edges of the chip while metallizing the via-holes.

Thus, the need exists for a simple method for providing plated vias from the front side of the wafer using a simple process flow which simultaneously forms wraparound plating.

SUMMARY OF THE INVENTION

The present invention provides a simple process for producing simultaneously plated via-holes and wraparound metal plating in semiconductor chips, with all operations for producing the plated via-holes and edge plating performed from the front side of the wafer. The method comprises the steps of:

(a) patterning a photoresist mask on the front surface of the wafer to open windows over the desired metal pads as well as over grid areas where wraparound plating is desired;

(b) etching off the exposed metal if necessary and forming via-holes and grooves in the wafer by etching, preferably by reactive ion etching, to a depth which is less than the total thickness of the wafer;

(c) plating the walls of the grooves and the via-holes with conductive metal;

(d) removing a portion of the back surface of the wafer ("backlapping") up to and including the floor of both the grooves and the via-holes, exposing the metal plating at the bottom of the via-holes and separating the individual chips; and, (e) depositing conductive metal on the back surface of the individual chips to complete the grounding path.

BRIEF DESCRIPTION OF THE DRAWINGS

A better understanding of the invention and its advantages will be apparent from the detailed description taken in conjunction with the accompanying drawings in which.

DETAILED DESCRIPTION OF THE INVENTION

Figures 1, 1A:
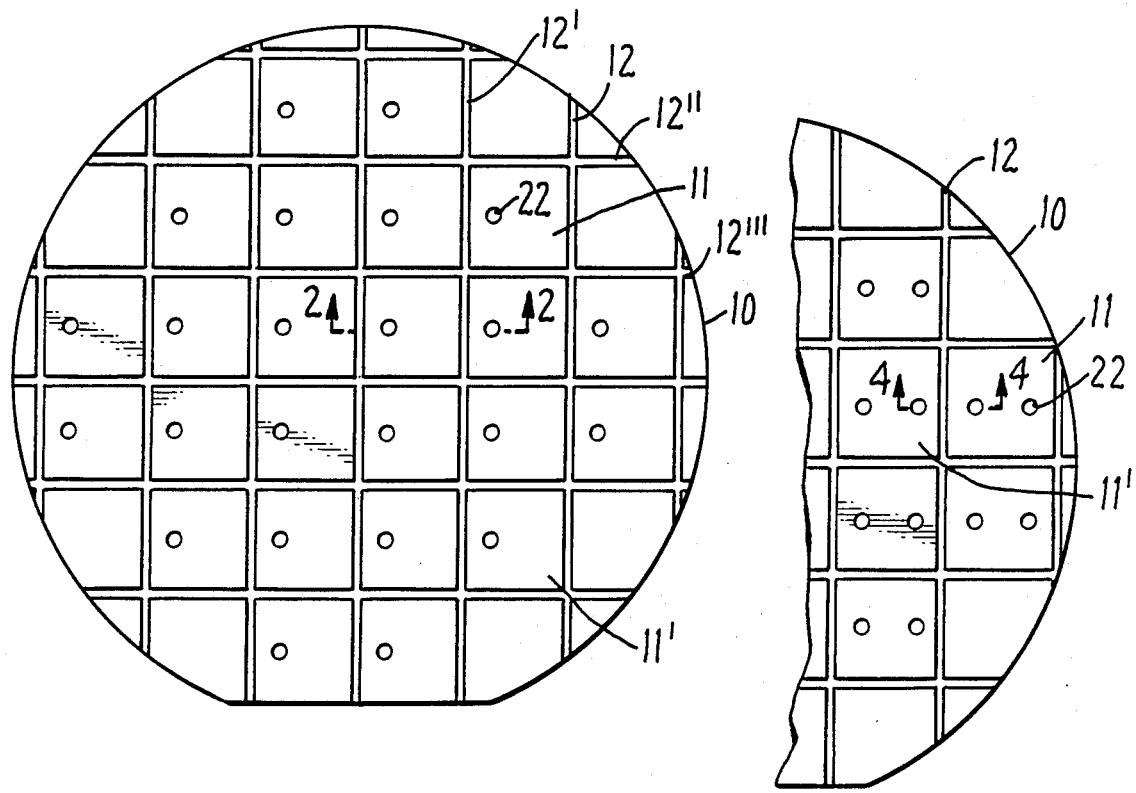
FIG. 1 is a top view of a semiconductor wafer with etched grooves and via-holes.
FIG. 1A is an enlarged fragmentary top view of a semiconductor wafer with etched grooves and having a slightly different pattern of via-holes from that illustrated in FIG. 1.

FIG. 1 shows a semiconductor wafer 10 such as are typically used to produce individual semiconductor chips 11, 11'. The wafer 10 can be produced from any useful semiconductor material such as silicon or gallium arsenide. The boundaries of the individual chip 11 are defined by grooves 12, 12', 12'', 12''' which are preferably etched into the semiconductor material. One or more via-holes 22 are also preferably etched into the semiconductor material for each individual chip 11, 11'.

FIG. 1A shows a semiconductor wafer 10 having grooves 12 etched into the semiconductor material and having a slightly different configuration of via-holes 22 etched into the semiconductor material.

Figure 4A:
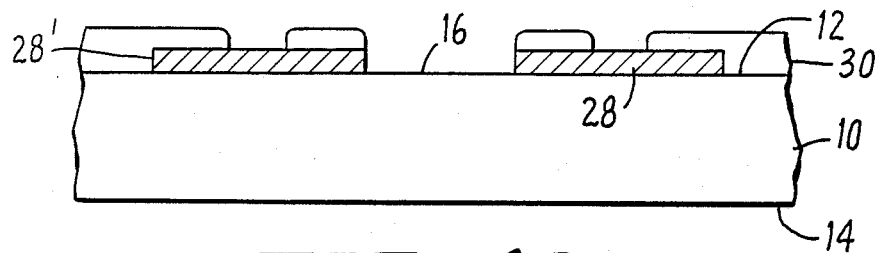

FIGS. 4A through 4F show a cross section of wafer 10 of FIG. 1A taken sequentially through line 4—4 to illustrate the basic steps in the process of the present invention. FIG. 4A shows the semiconductor wafer 10 with metal pads 28 already formed using conventional photoresist methods. The front surface 12 of the semiconductor wafer 10 is then coated with photoresist 30 and processed with a mask to form a pattern on the front surface 12 to open windows over the metal pads 28 as well as the areas for grooves 16. Because all alignment is performed from the front side 12 (device side), no infrared alignment equipment is required.

Figure 2:
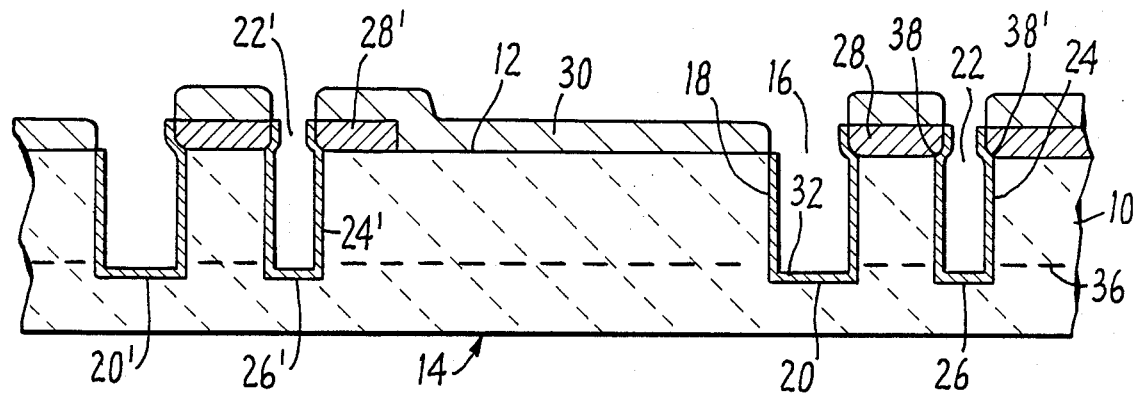
FIG. 2 is a sectional side view taken along line 2—2 of FIG. 1.
Figure 4B:
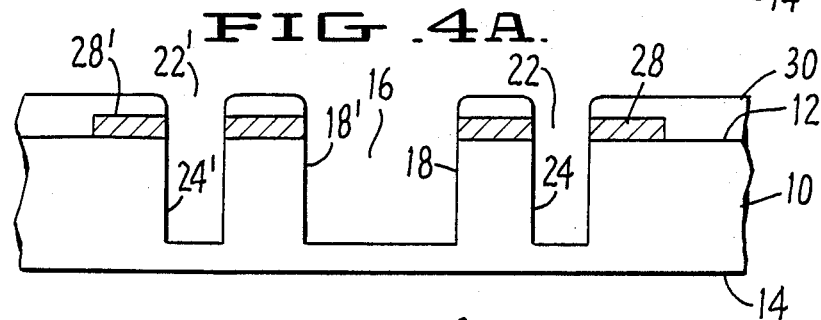
Figure 4C:
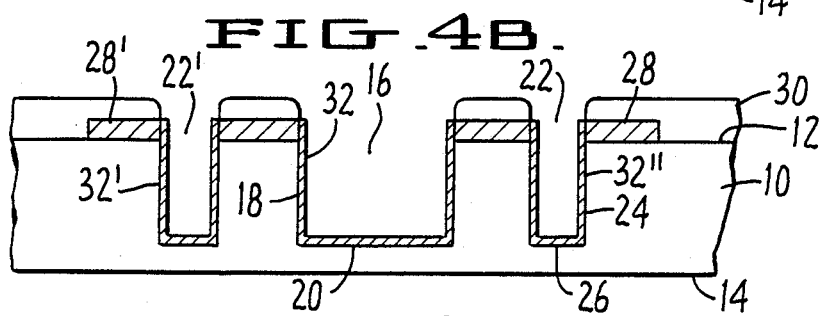
Figure 4D:
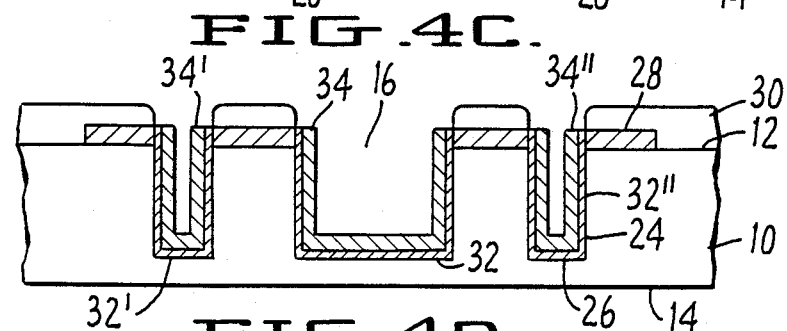

The metal in pad 28 exposed by this step can be etched off if desired. This is followed by etching to form the grooves 16 and via-holes 22 as shown in FIG. 4B. Grooves 16 and via-holes 22, 22' are preferably reactive ion etched in order to provide side walls which are substantially perpendicular to the front surface 12. While wet-chemical etching can also be used, this will lead to graded side walls and the need for spacing large enough to allow for side wall grading. This initial etching step is preferably followed by chemical etching to provide an undercut along the top surface of groove walls 18, 18' and via-hole walls 24, 24' as shown in FIG. 2. Alternatively, the undercut can be omitted as shown in FIGS. 4B through 4E.

The next step in the process is to plate the via-holes 22, 22' and the grooves 16 with conductive metal. The preferred method for doing this is the two-step process shown in FIGS. 4C and 4D. In the first step of the preferred two-step process, a thin layer of conductive metal 32 is deposited along the groove wall 18, the groove floor 20, the via-hole wall 24 and the via-hole floor 26, shown in FIG. 4C, preferably using electroless techniques, to connect the electrical path from the via-holes 22 to the grooves 16 through the metal pads 28. This conductive metal layer 32 is most preferably produced from a noble metal which does not easily form a native oxide in air. Palladium is a preferred choice for layer 32, although gold may also be used. In the second step, illustrated in FIG. 4D, the layer 32 is plated with a second layer of conductive metal 34 preferably using electrolytic methods. Any metal suitable for electroplating can be used to form layer 34. However, gold or platinum are preferred. During the electrolytic process, the layer 32 is used as a cathode and the plating solution is ultrasonically agitated. The surfaces not to be plated are protected by the photoresist 30. Ultrasonic agitation provides uniform plating of the bottom and inside walls of the via-holes 22 and grooves 16. Such uniform plating is particularly difficult to achieve in the absence of ultrasonic agitation where the walls 24 of the via-holes 22 are very steep and the diameter is small in comparison to the depth of the via-hole 22. Such is the case with reactive ion etched via-holes where a depth-to-diameter ratio of up to 3 can be routinely achieved. In these situations, ultrasonic agitation ensures sufficient electrolyte transport into the holes for uniform plating. Layer 34 can be formed as thick as necessary to provide efficient electrical conduction through the via-hole 22 and across the metal pad 28 to the abutting layer 34 deposited on groove walls 18. Electrolytic plating is well known to those of skill in the art and need not be described in detail here.

Figure 4E:
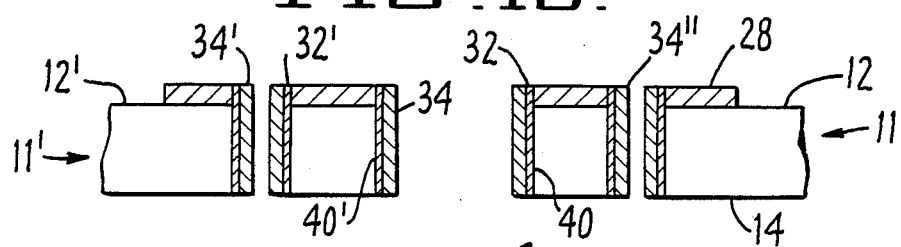

When sufficient conductive metal has been deposited in the grooves 16 and via-holes 22, the photoresist layer 30 is removed and the wafer 10 is backlapped to separate the individual chips 11, 11', as shown in FIG. 4E. Wax is used to mount the front side of wafer 10 to a lapping block in preparation for backlapping. In backlapping, grinding is used to remove the material from the back surface 14 of the mounted wafer 10 along with both the groove floor 20 and the via-hole floor 26. Preferably only the minimum amount of wafer material is removed in this process. Thus, backlapping preferably removes material from the back surface 14 of the wafer 10 up to and including either the groove floor 20 or the via-hole floor 26, whichever is shallower as measured from the front surface 12. This exposes the conductive metal on the walls of the via-hole 22 and separates the chips, with the former groove walls 18, 18' becoming the chip edges 40, 40'. Because backlapping occurs during the final stages of the process, handling and breakage problems during processing are minimized.

Figure 4F:
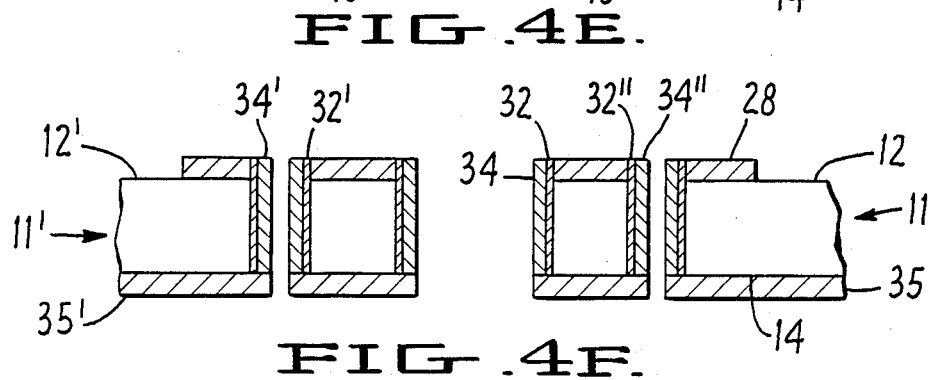

To complete the grounding path and finish the wraparound plating, the back surface 14 of each chip 11 is plated with conductive metal 35 as shown in FIG. 4F. This is preferably done using electroless techniques. Finally, the wax is cleaned off and the individual chips are removed from the lapping block.

FIG. 2 shows the cross-section of the wafer 10 of FIG. 1 taken through line 2-2 of FIG. 1 at an intermediate point in the above described process of the present invention, i.e. at the point described in reference to FIG. 4B. FIG. 2 shows the substantially perpendicular walls 18 of the grooves 16 and the substantially cylindrical wall 24 of each via-hole 22, 22'. The depth of the grooves 16 and the via-holes 22, as measured from the front surface 12 of the wafer 10 are less than the thickness of the wafer 10. An undercut 38, 38' is preferably provided near the front surface 12 for each groove wall 18 and each via-hole wall 22 for obtaining a more consistent electrical path for the electroplating process.

Prior to the formation of the holes 22, 22' and groove 16, 16', metal pads 28, 28' were formed on the front surface 12 of the wafer 10 using conventional photoresist methods. Photoresist 30 has been applied to cover the face 12 of the wafer 10, including the metal pads 28, 28', except where windows to the front surface 12 of the wafer 10 were opened using a photoresist mask to allow selective etching of the pads 28, 28' and the front surface 12 to produce the grooves 16, 16' and the via-holes 22, 22' through the pads 28, 28' respectively. A thin layer of conductive metal 32 has been electroless deposited on the groove walls 18, 18' and groove floors 20, 20' and on the via-hole walls 24, 24' and via-hole floors 26, 26'. As previously described, during a succeeding step the back surface 14 of the wafer 10 will be removed to the backlap limit 36, identified in FIG. 2 by a dashed line. The backlap limit 36 will be determined by the depth of the grooves 16 and the via-holes 22 as measured from the front surface 12; with the backlap limit 36 extending so as to substantially remove the shallower of the groove floor 20 or the via-hole floor 26 in order to completely separate the individual chips.

Figure 3:
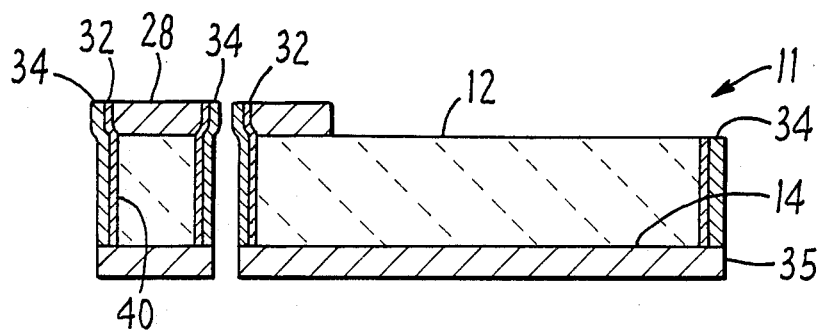
FIG. 3 is a sectional side view of an individual chip after backlapping and plating of the back surface; and, FIGS. 4A through 4F are a series of sectional side views of the semiconductor wafer taken along line 4—4 of FIG. 1A which illustrate the various steps of the process.

FIG. 3 shows a completed individual chip produced by the process of the present invention. This clearly shows the wraparound plating produced after backlapping when the back surface 14 is plated with conductive metal 35. Thus, for each individual chip 11, grounding is provided through the conductive metal 32, 34 through two paths: directly to the conductive metal 35 on the back surface 14 through the via-hole 22; and, to the conductive metal 35 on the back surface 14 through the metal pad 28 and through the conductive metal 32, 34 on the edge 40 of the chip 11. This provides more reliable grounding to back surface 14 and strengthens the edges of the individual semiconductor chips 11.

A chip 11 produced in accordance with the process of the present invention has "wraparound" plating which extends from the top of the chip edges adjacent to the front surface, to the metallized bottom, resulting in additional grounding and edge protection of the chip 11. Thus, two electronic conductance paths lead to the metallized back surface 14 on the chip 11: one path leads directly through the plated via-hole 22 to the back surface 14; while the other path leads from the top of the plate via-hole 22 through the metal pad 28 through the metal plating 32, 34 on the chip edge 40 to the plating 325 on the back surface 14.

One skilled in the art will recognize at once that it would be possible to modify the process of the present invention in a variety of ways. While the preferred embodiment has been described in detail and shown in the accompanying drawings, it will be evident that various further modifications are possible without departing from the scope of the invention as embodied in the claims.

We claim:

1. A method for simultaneously producing plated via-holes and wraparound plating in semiconductor chips formed from a semiconductor wafer having a front surface including a plurality of metal pads, a back surface, and a thickness measured from the front surface to the back surface, the method comprising the steps of:
   (i) forming via-holes and grooves in the wafer from its front surface, the grooves defining the boundaries of individual semiconductor chips, the grooves and the via-holes extending from the front surface of the wafer to a depth within the wafer which is less than the total thickness of the wafer, the via-holes being formed through selected metal pads, the grooves and via-holes each having walls and a floor;
   (ii) simultaneously plating the walls and floor of the grooves and the via-holes with conductive metal;
   (iii) removing a portion of the back surface of the semiconductor wafer to a depth sufficient to remove the floor of both the grooves and the via-holes, thereby exposing the metal plating located on the walls of both the via-holes and the grooves, thus separating the individual chips; and
   (iv) plating the back surface of the individual chips with conductive metal.

2. The method as recited in claim 1 wherein the steps of forming the grooves and via-holes is by applying photoresist to the front surface of the wafer, exposing and developing the photoresist using a pattern to create a mask, and etching the grooves and via-holes using this mask.

3. The method as recited in claim 2 in which the grooves and via-holes are etched by reactive ion etching.

4. The method as recited in claim 1 wherein the steps of depositing the conductive metal plating on the walls and floors of the grooves and on the walls and floors of the via-holes includes the steps of electroless depositing a first layer of conductive metal on walls and floor of the grooves and the via-holes and then depositing on the first layer of conductive metal a second layer of conductive metal by electrolytic plating.

5. The method as recited in claim 4 wherein the step of depositing the first layer of conductive metal comprises electroless plating a layer of palladium.

6. The method as recited in claim 4 wherein the step of depositing the second layer of conductive metal comprises the step of electrolytically plating one or more metals selected from the group comprising gold and platinum.

7. The method as recited in claim 4 wherein the electrolytic step further comprises electrolytic plating while ultrasonically agitating the electrolyte.

8. The method as recited in claim 1 wherein the step of plating the conductive metal on the back surface of the chips comprises the step of electroless plating the back surface with the conductive metal.

* * * * *

UNITED STATES PATENT AND TRADEMARK OFFICE
CERTIFICATE OF CORRECTION

PATENT NO. : 4,978,639

DATED : Dec. 18, 1990

INVENTOR(S): Hua et al

It is certified that error appears in the above - identified patent and that said Letters Patent is hereby corrected as shown below:

Col. 1, line 17 should read:
"rality of chips can be produced. The dimensions of the"

Col. 5, line 53 should read:
"plated via hole 22 through the metal pad 28 through the"

Col. 5, line 55 should read:
"3[2]5 on the back surface 14."

Signed and Sealed this

Twenty-first Day of April, 1992

Attest:

HARRY F. MANBECK, JR.

Attesting Officer     Commissioner of Patents and Trademarks